United States Patent [19]

De Sandre et al.

[11] 3,961,170

[45] June 1, 1976

[54] FIXED POINT TO FLOATING POINT CONVERSION IN AN ELECTRONIC COMPUTER

[75] Inventors: Giovanni De Sandre, Brugherio (Milan); Angelo Subrizi, Ivrea (Turin); Franco Bretti, Are' Di Caluso (Turin), all of Italy

[73] Assignee: Ing. C. Olivetti & C., S.p.A., Ivrea (Turin), Italy

[22] Filed: Apr. 17, 1974

[21] Appl. No.: 461,558

Related U.S. Application Data

[63] Continuation of Ser. No. 246,735, April 24, 1972, Pat. No. 3,828,322.

[30] Foreign Application Priority Data

Apr. 22, 1971 Italy .................................. 68336/71

[52] U.S. Cl. .............................. 235/154; 235/156; 340/172.5
[51] Int. Cl.² .......................................... G06F 5/02
[58] Field of Search ........... 235/154, 156, 159, 160, 235/164; 340/172.5

[56] References Cited
UNITED STATES PATENTS

| | | | |
|---|---|---|---|
| 3,037,701 | 6/1962 | Sierra.................................. | 235/159 |
| 3,389,379 | 6/1968 | Erickson et al.................. | 340/172.5 |
| 3,701,976 | 10/1972 | Shively............................ | 340/172.5 |
| 3,795,897 | 3/1974 | Cazanove........................ | 340/172.5 |
| 3,828,322 | 8/1974 | De Sandre et al............... | 340/172.5 |

*Primary Examiner*—Gareth D. Shaw
*Assistant Examiner*—Michael C. Sachs
*Attorney, Agent, or Firm*—I. J. Schaefer

[57] ABSTRACT

In a digital electronic computer which comprises a memory including a first and a second register, the first register is receptive of a number to be converted from fixed to floating point notation and the second register is receptive of a significant zero digit with an associated decimal point. Shifting means including a register is operable to shift the contents of either register and aligning means is operable to cause shifting of the second register until the decimal point stored therein is aligned with the decimal point in the first register. Indicating means indicates whether the number stored in the first register is greater or less than one and the shifting means next begins shifting the contents of one or the other of the registers when the number is indicated greater or less than one respectively.

A control means includes a detecting means for stopping the shifting means when the decimal point of the second register becomes aligned with the location of the next higher order with respect to the highest significant digit of the first register. The control means also includes counting means which is incremented or decremented by one for each shifting operation in dependence on the direction of shifting.

The resultant numbers in the first and second registers represent the mantissa and exponent respectively, of the desired floating point number.

1 Claim, 11 Drawing Figures

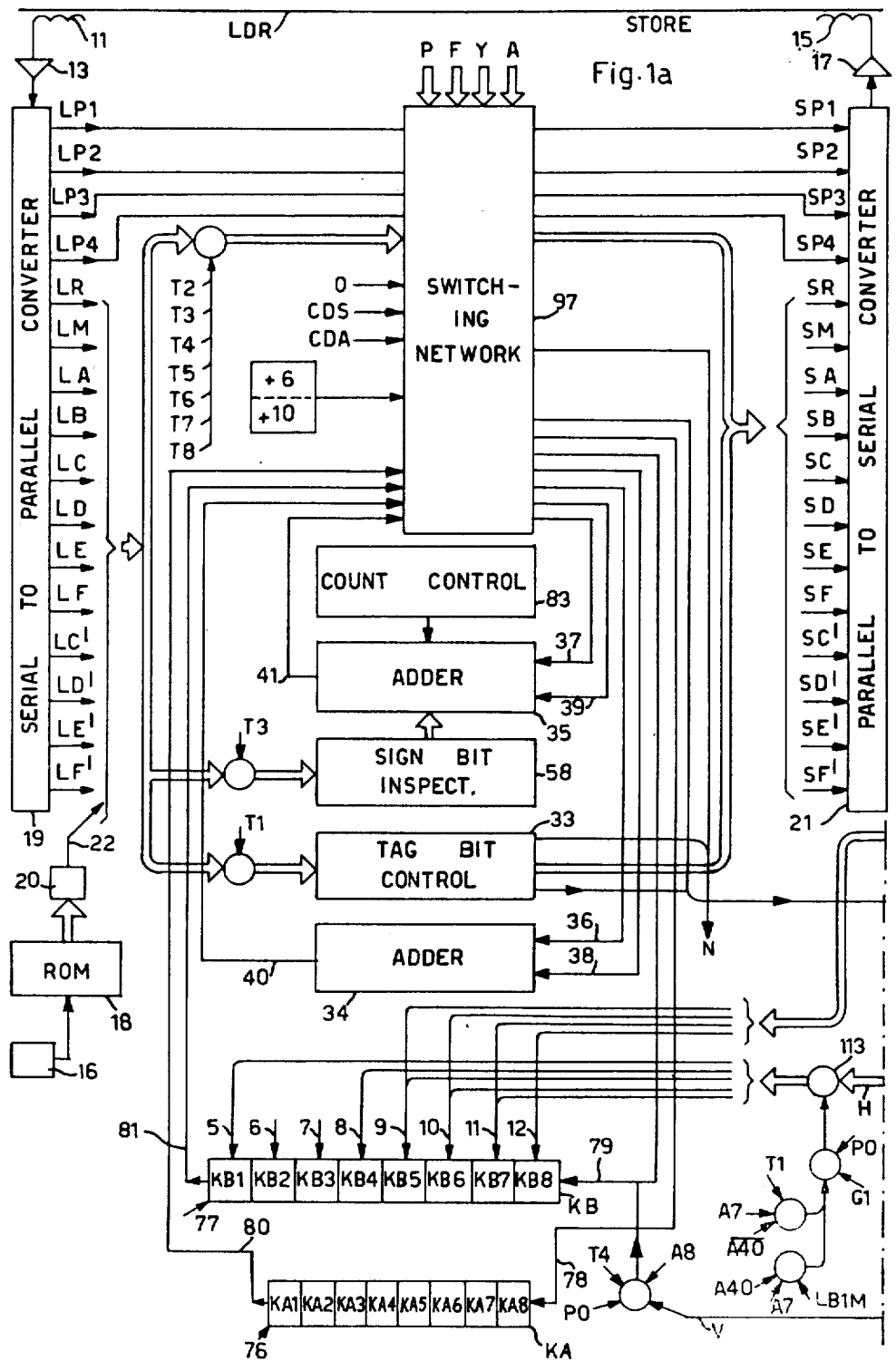

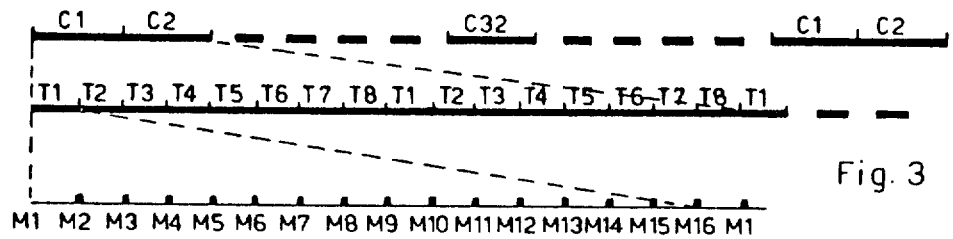
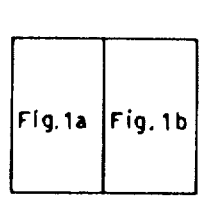
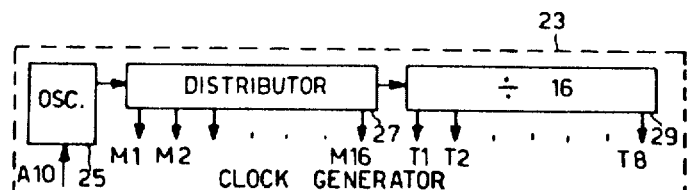
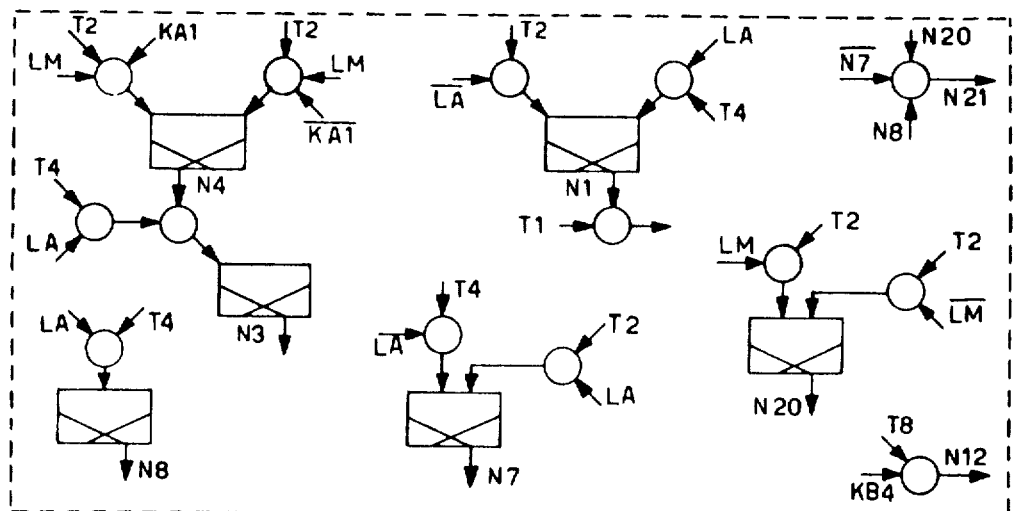
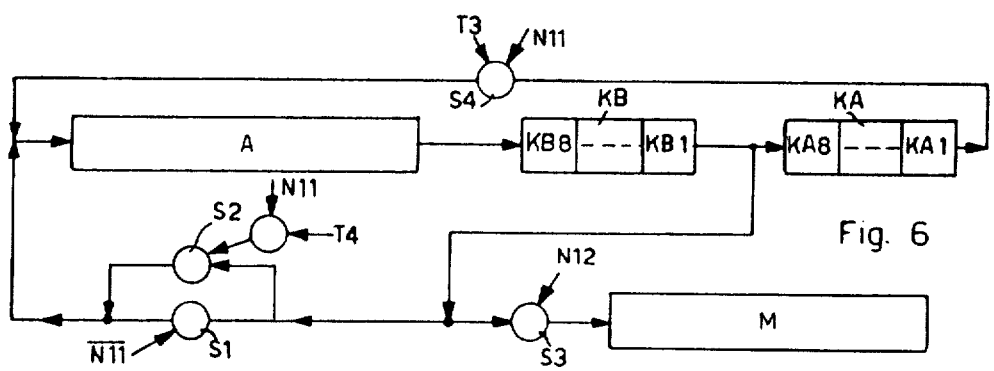

FIXED POINT TO FLOATING POINT CONVERSION IN AN ELECTRONIC COMPUTER

This is a continuation of application Ser. No. 246,735 filed on Apr. 24, 1972 and now U.S. Pat. 3,828,322.

This invention relates to digital computers and more particularly to data handling techniques in these computers; the invention also relates to improved means for reading magnetic cards.

It is often desired to read numerical information out of a computer in a certain format which includes symbols. The computer's registers generally contain only numbers which, without symbols may be meaningless. For example, a register may contain 92441 but what is desired is the date 9/24/41. According to the invention, the number is placed in one register, the symbols in a second, and the registers are properly alined, and the number and symbols are shifted in the proper order to a third register.

According to another aspect of the invention, means are provided whereby the number of digits which are used during calculation can be limited. The desired limiting number is placed in a shift register which is closed on an adder to form a counter, the most significant digit in a working or operation register is found, and by appropriately counting and erasing, the least significant digits in the working register are eliminated.

According to another aspect of the invention, means are provided for converting from fixed to floating point notation and vice-versa.

According to another aspect of the invention, an improved magnetic card reader uses profiled guides mounted between support plates with one of the plates rigidly supporting the reading head. An entrainment belt is used to move the card along the path defined by the guides.

BRIEF DESCRIPTION OF THE DRAWINGS

FIG. 1 shows the relationship between FIGS. 1a and 1b;

FIGS. 1a and 1b depict the general block diagram of the preferred embodiment of the computer according to the invention;

FIG. 2 is a block diagram of the timing device used by the computer illustrated in FIGS. 1a and 1b;

FIG. 3 is a diagram of the relationship which exists among signals present in the computer according to FIGS. 1a and 1b;

FIG. 4 illustrates in detail a number of conditioning circuits included in the computer according to FIGS. 1a and 1b;

FIG. 6 illustrates the connections which permit the execution of the separation instruction;

INTRODUCTION

This portion will introduce the reader to the computing system in which the instant invention is used. This computing system is described in detail in U.S. Pat. Nos. 3,304,418, 3,469,244, 3,495,222 and 3,636,523 and this introductory portion is a condensation of the concepts discussed in detail in the above cited patents. The reader who wishes to proceed directly to the following chapters should be reminded that each digit present in the memory is represented by 8 bits B1—B8. B1 is reserved for tag or flag bits, B2 indicates that a digit is actually present in this group of 8 bits, B3 is the sign + or —, and B4 is the decimal point. Bits B5–B8 represent the number 0–9 in binary code.

Figure 1B:
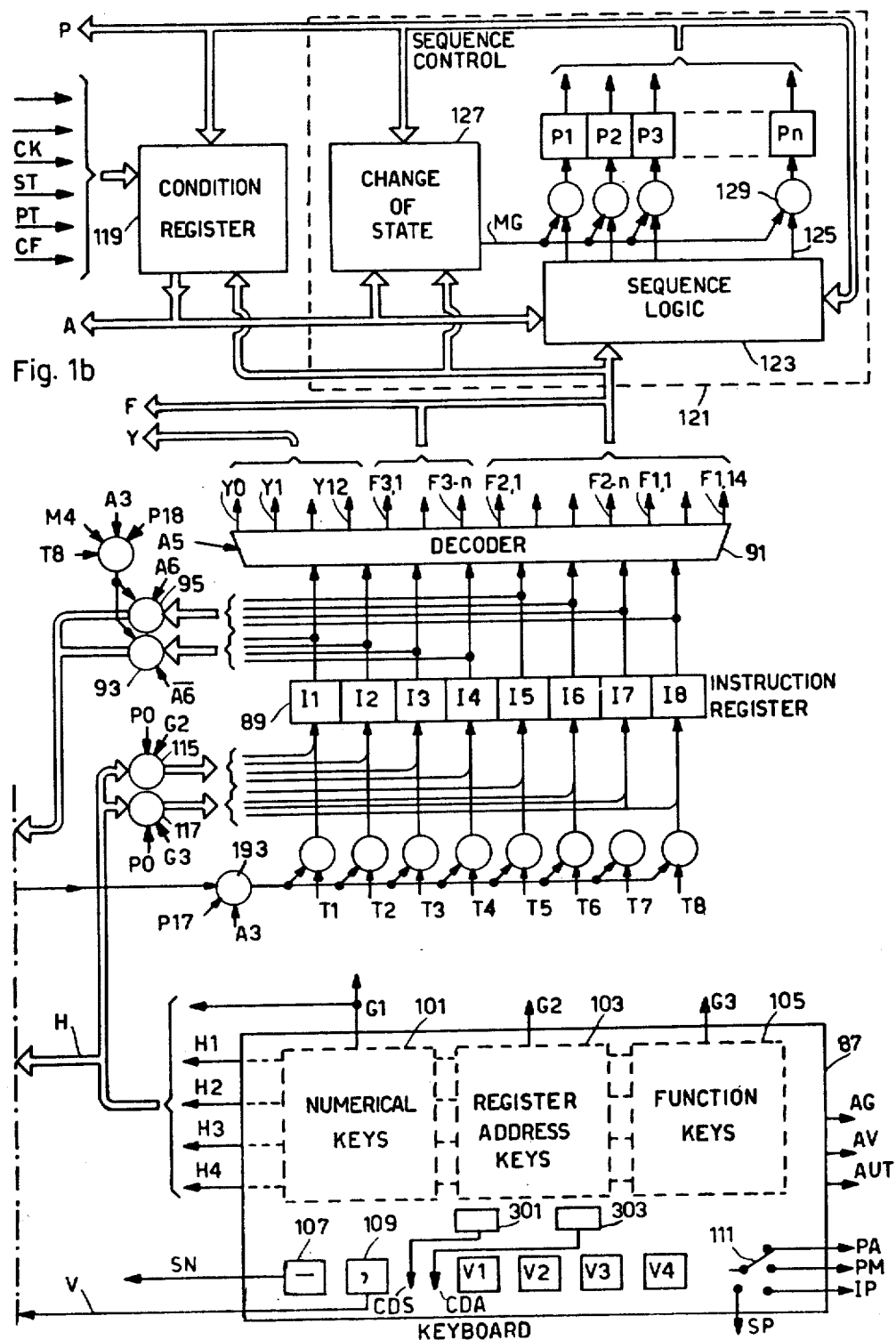

Referring to FIGS. 1a and 1b, the computer comprises a magnetostrictive delay line store LDR which has, for example, 16 conceptual registers P1, P2, P3, P4, R, M, A, B, C, D, E, F, C', D', E' and F' which are continuously circulating through the line. The line LDR includes a reading transducer 11 which feeds a reading amplifier 13, and includes a writing transducer 15 fed by a writing amplifier 17.

Each store register carried by the line LDR can comprise 31 decimal digits each digit composed of 8 binary bits; in other words, each register can store up to 31 characters of 8 bits each. Both the characters and the bits are processed serially. Therefore, a train of 16 × 31 × 8 binary signals continuously circulates in the delay line LDR.

The first 16 binary signals which appear in the line LDR represent respectively the first bits of the first decimal digits (or character) of the 16 registers P1, P2, P3, P4, R, M, A, B, C, D, E, F, C', D', E' and F', while the following 16 binary signals represent respectively the second bits of the first decimal digits of the said registers, and so forth.

If, for example, the binary signals are stored in the line LDR by the no-return-to-zero technique, in such manner that they are spaced from one another by ½ microsecond, the signals belonging to a certain register will be spaced from one another by 8 microseconds. Each register contains a train of 8 × 31 binary signals spaced from one another by 8 microseconds; the signals belonging to the separate registers are spaced from one another by ½ microsecond.

The reading amplifier 13 feeds a serial-to-parallel converter 19 which produces on sixteen separate output lines LP1, LP2, LP3, LP4, LR, LM, LA, LB, LC, LD, LE, LF, LC', LD', LE' and LF' 16 simultaneous signals representing the 16 bits contained in the same binary position of the same decimal digit of the 16 registers.

Therefore, at a given instant, 16 signals representing the first bit of the first decimal digit of 16 registers are simultaneously present on the 16 output lines; eight microseconds later, 16 signals representing the second bit of the first decimal digit are present on the said output lines, etc.

After each group of 16 signals sent simultaneously on the output lines of the converter 19 has been processed, it is sent to the parallel-to-serial converter 21. The converter 21, in turn, feeds the writing amplifier 17 with the 16 signals restored to their previous serial order and spaced from one another by ½ microsecond. The transducer 15 therefore writes the signals a-new in the line LDR, either modified or not by the operation of the computer, the signals maintaining their original relative positions. It is therefore clear that, as it appears to the rest of the computing harware, the sole delay line LDR is equivalent to a group of 16 delay lines operating in parallel, each containing a single register and provided with input and output lines.

The interlacing or the arrangement in interposition of the signals of the delay line enables all the registers of the computer to be contained in a single delay line provided with a single reading transducer and a single writing transducer; the cost of the store is, therefore, substantially the same as that of a delay line containing merely a single register. Moreover, since the pulse repetition frequency in the delay line is 16 times greater than in the other circuits of the computer, it is possible to obtain good utilization of the storage capacity of the delay line while using low-frequency, low-cost, circuits in the other parts of the computer.

Since the delay line store is of a cyclic nature, the operation of the computer is divided into successive store cycles, each cycle comprising 32 digit periods from C1 to C32 and each digit period being divided into 8 bit periods from T1 to T8.

Referring to the diagram of FIG. 2, a clock pulse generator 23 produces at the outputs of the lines T1 to T8 successive clock pulses of 8 microseconds, each indicating the corresponding bit periods (as seen in the timing diagram of FIG. 3). The output terminal T1 is activated during the entire first bit period of each of the 32 digit periods; the output of the terminal T2 is similarly activated during the entire second bit period of each digit period, etc.

The clock pulse generator 23 is synchronized with the delay line LDR in such manner that the beginning of the *n*th bit period of the period of the *m*th digit coincides with the instant at which the 16 binary signals representing the bits read in the *n*th binary bit of the *m*th decimal digit of the 16 store registers begin to appear at the outputs of the lines of the serial-to-parallel converter 19. These binary signals are stored in the converter 19 for the duration of the corresponding bit period. During the same bit period, the signals representing the 16 bits produced by the processing of the said 16 bits read on the delay line LDR are sent to the parallel-to-serial converter 21 and written in the delay line.

During each bit period, the generator 23 (FIG. 2) also produces 16 pulses M1 to M16 (FIG. 3). The pulse M1 defines the reading time, in other words the instant at which the serial-to-parallel converter 19 begins to render the bits belonging to the current bit period utilizable. The pulse M4 indicates the writing time, that is the instant at which the bits being processed are sent to the parallel-to-serial converter 21 for effecting the writing into the delay line LDR.

The generator 23 comprises an oscillator 25 which, when in operation, feeds the pulse distributor 27 with pulses having the frequency of the pulses M1 to M16. A frequency divider 29 fed by the distributor 27 generates the clock pulses T1 to T8. The oscillator is in operation only as long as a bistable device controlled by the signals circulating in the delay line LDR remains activated.

Each decimal digit location of the store LDR can contain a decimal digit or an instruction. The registers P1 to P4 can be used only to contain the instructions of a program; each register can contain up to 31 instructions. The registers C, D, E, F, C', D', E' and F' can each be used to store up to 31 instructions or up to 30 data digits; the machine therefore has a program capacity equal to 372 instructions. The register B can be used only for storing data. The store registers are used in the following order in the recording of program instructions: P1, P2, P3, P4, C', D', E', F', C, D, E, F. The registers M, A and R are operation registers, used for storing operands and results of operations.

The program instructions of the present computer may have three formats. The basic format of an instruction is an eight-bit character in which the last four bits represent one of the 14 possible function codes, while the first four bits represent the store register in which the operation is to be developed.

The address part of the instruction may refer to a field which begins with the first bit of the first digit or of the 16th digit of a register according to whether the same register or the subdivided part is addressed. For this reason, the register may be subdivided into two sections and store two independent segments of information.

Among the instructions which are of this basic format, there are the arithmetical instructions, transfer instructions, the instructions for printing numbers on the internal printer, and a number of jump instructions in which the addresses define a recognition code for the end of the jump. Also included in this first format type of instruction are the instructions for floating point calculation which enable the computer, normally operating on a fixed point basis, to calculate on numeric data on a floating point basis. A floating point numeric datum is represented by means of a coefficient greater than or equal to 0.1 and smaller than 1. and the corresponding exponent to base 10.

The instructions provided allow the conversion of the numeric data from one representation to the other. These instructions are as follows:

Separation instruction: the content of the register A is modified by transferring the integral part thereof, i.e., the exponent, to M and leaving only the decimal part, i.e., the fixed point part, in A.

Joining instruction: joins in the register A the integral part of the datum contained in the register M to the decimal part of the datum contained in A.

Conversion-to-fixed-point instruction: shifts the point of the content of the register A by a number of places equivalent to the value of the datum contained in the register M. If the content of M is positive, the point is shifted to the right, if it is negative it is shifted to the left.

Normalization instruction: shifts the point of the numeric datum contained in A to precede the first significant digit; stores in M the number of steps by which the point has been shifted with a positive sign if the shift has occurred to the left and with a negative sign if to the right.

The instructions of the second format are constituted by a pair of digits each of eight bits B1 to B8 and disposed in a pair of adjacent decimal digit locations of the store. Among the instructions which have this format there is that for sending a numeric datum to external units with provision for control of format. This instruction enables a numeric datum contained in the register A to be read out, it being possible to interpose punctuation or separating marks or signs or the like between successive characters so as to give the read-out particular formats. The first four bits B1 to B4 of the first digit contain the address of the register from which the extraction takes place, while the second four bits B5 to B8 contain the function code. The second digit selects the particular output device. More particularly, the first bit B1 of the second character indicates whether the information which is to be read-out is numeric or alphanumeric. The following two bits B2 and B3 select the particular output device, while the fourth bit B4 indicates whether an input or output instruction is involved.

An instruction of the third format is constituted by eight bits B1 to B8 which indicate collectively a function code. To the third format there belong, for example, the instructions controlling transfer between predetermined logic elements, the calculation of percentages, a number of jump operations, indirect addressing, and the addressing of the subdivided registers.

Each decimal digit of the data is represented in the computer by means of four bits B5, B6, B7 and B8 in accordance with a binary decimal code. In the delay line store LDR, these four bits are recorded respectively in the last four bit locations T5, T6, T7, T8, while the first four bit locations are used for storing the tag bits. The bit location T4 is used for storing a decimal point bit B4, which is "0" for all the digits of a decimal number with the exception of the first digit after the decimal point. The bit location T3 is used for storing a sign bit B3, which is "0" for all the decimal digits of a positive number and "1" for all the decimal digits of a negative number.

The bit location T2 is used for storing a digit identification bit B2, which is 1 in each decimal digit location occupied and 0 in each decimal digit location unoccupied (non-significant zero).

Therefore, the complete representation of a decimal digit in the store LDR requires seven bit locations, T2, T3, T4, T5, T6, T7 and T8, of a given decimal digit location. The remaining bit location T1 is used for storing a service bit B1, the significance of which is not necessarily related to the decimal digit stored in the said digit location.

In the following description, a bit stored in a binary bit location $a$ of a decimal digit location of a register $b$ is designated by the symbol Bab, while the signal obtained when the bit is read on the line LDR is indicated by the symbol LBab. A bit B1R = 1 stored in the first decimal digit location C1 of the register R is used to start the clock pulse generator 23 at the beginning of each store cycle. A bit B1E = 1 stored in the 32nd decimal digit location C32 of the register E is used to stop the generator 23. A bit B1B = 1 stored in the $n$th decimal digit location of the register B indicates that during the execution of a program the following instruction to be executed is stored in the $n$th decimal place of the particular program register which is used. A binary 1M = 1 stored in the $n$th location of the register M indicates: that, when the keyboard enters a number in the register M, the decimal digit entered thereafter is to be stored in the ($n-1$) decimal digit location, that when an instruction is entered from the keyboard the following instruction is to be stored in the $n$th decimal digit location of a store register, that when a number stored in any register is printed the digit to be printed is the digit stored in the $n$th decimal digit location of the said register, and finally, that when two numbers are added, the digit of the sum stored in the $n$th decimal digit location of the register A is then to be corrected by means of the addition of a correction digit introduced therein. A bit B1A = 1 stored in the $n$th decimal place of the register A indicates that the execution of the main body of a program has been interrupted at the $n$th instruction of a store register for the purpose of commencing the execution of a subroutine. Therefore, the tag bits B1R, B1E are used to represent fixed reference points in the various registers (beginning and end, respectively), while the tag bits B1A, B1B and B1M represent movable reference points within the registers. Moreover, the bit B1M is used during the execution of an addition to store in each decimal place the information belonging to an operation which is to be executed in the said decimal place.

The operation of regeneration, modification and shifting of the said tag bits B1 are carried out by a tag-bit control circuit 33.

The computer also contains two adders 34 and 35 each of which has a pair of input lines 36, 38 and 37, 39 respectively, for receiving simultaneously the bits to be added. A sum bit is applied to the output lines 40 and 41, respectively.

Said two adders 34 and 35 are of the type described in the applicants' aforecited U.S. Pat. No. 3,304,418.

Referring to FIG. 1, the computer comprises a read-only store ROM connected to the control and arithmetic units in a similar manner to the delay line store, of which it can be regarded as an extension. The said store contains 512 instructions which constitute a collection of fixed subroutines to which access can be gained by means of jump instructions during the execution of the main program whenever this may be necessary.

The read-only store (ROM) 18 is provided with its own addresser 16; the characters contained in the ROM issue as eight bits in parallel and are serialized by a parallel-to-serial converter 20, which produces on its output line 22 eight successive signals, starting from the least significant bit, which represent the character being output.

The operation of the converter 20 is timed by the pulses on the lines T1 – T8 of the clock pulse generator 23, so that each of the said signals remains on the output line 22 for 8 microseconds, that is for as long as each bit issuing from the serial-to-parallel converter 19 remains on the corresponding output line.

Still referring to FIG. 1, the computer comprises two shift registers KA and KB formed by eight binary stages KA1 – KA8 and KB1 – KB8, respectively. On the reception of a shift pulse through the terminals 76 and 77, respectively, the bits stored in the stages KA2 – KA8 and KB2 – KG8 are shifted to the stages KA1 – KA7 and KB1 – KB7, respectively. If bits are present on the input lines 5 to 12, the shift pulse causes them to be transferred to the stages KB1 – KB8, respectively.

The pulses M4 generated by the pulse distributor 27 (FIG. 2) are used as shift pulses for the registers KA and KB, which therefore receive one shift pulse during each bit period, or eight shift pulses during each digit period. The contents of each stage of each register remain unchanged from the pulse M4 of each bit period up to the pulse M4 of the following bit period. The bit sent to an input line 78 or 79 of the registers KA and KB during a particular bit period is available on the output line 81 or 82 of the respective register 8 bit periods later, (i.e., one digit period later). The registers KA and KB can therefore be regarded as a section of the delay line having a length corresponding to one digit period.

By connecting a store register and one of the shift registers KA and KB in a closed loop while all the remaining registers are left with their outputs connected directly to their respective inputs, the register selected is effectively lengthened by one digit period with respect to the remaining registers. Therefore, during each store cycle, the contents of the register selected are shifted by one decimal digit place, that is they are delayed by one digit period with respect to the other registers.

Due to the ability of the registers KA and KB to function as delay lines, they can also be used as counters according to the method described on page 198 of the book "Arithmetic Operations in Digital Computers" by R. K. Richards, 1955. When registers input lines 78 and 79 and their output lines 80 and 81 are connected to the output lines 40 and 41 and to the input lines 36 and 37 of the adders 34 and 35, while the latter lines do not receive any signal, the counters count the successive count pulses which are sent to two bistable storage devices included in the two adders 34 and 35 by means of the Count Control Circuit 83 as described in applicants' aforecited U.S. Pat. No. 3,636,523.

The register KB can also be used as a buffer store for temporarily storing a decimal digit.

Finally, the register KB functions as a parallel-to-serial converter in the transfer of data or instructions from the keyboard 87 to the store LDR, as more fully described in the applicants' aforecited U.S. Pat. No. 3,469,244.

The instruction register 89 (FIG. 1b) comprises eight binary stages 11–18 containing the 8 bits of the instruction being executed. The register 89 transfers its contents to the decoder 91, which has outputs Y1 to Y12; F1.1 to F1.14; F2.1 to F2.n; F3.1 to F3.1n corresponding to the 12 addressable store registers and the aforesaid instructions, respectively.

If an instruction of the first format is stored in the register 89, the outputs from the stages 11 – 14 to the decoder 91 activate one of the address outputs Y1 to Y12. This output selects one of the 12 store registers or, if the instruction is a jump instruction, specifies one of the jump codes. The inputs I5 – I8 cause the decoder 91 to activate one of the function outputs.

If the instruction belongs to the second format, only the first character of the instruction is stored in the register 89; if the instruction for output of information with or without control of vertical format is stored, one of the outputs Y1 to Y12 is activated by means of the bits B1 – B4 for the purpose of selecting the store register containing the data to be transmitted, while the bits B5 – B8 activate the respective function output of the decoder 91.

In the case of an instruction of the third format, one of the outputs F3.1 – F3.n of the decoder 91, each corresponding to a special instruction, is activated.

The outputs of the stages 11 – 14 and the outputs lines of the stages 15 – 18 can also be connected through the gates 93 and 95, respectively, to the input lines of the stages KB5 – KB8 of the register KB for the purpose of printing the address and the function stored in the said stages.

The gates 93 and 95 are controlled by the AND of the signals T8, M4, A3 and P18 and by the absence or the presence of the signal A6.

A switching network 97 is provided for selectively interconnecting the 16 store registers, the adders 34 and 35, the shift registers KA and KB, the instruction register 16, and the input and output devices for controlling the transmission of the data and instructions to and from the various parts of the computer. The switching circuit 97 may consist of a diode matrix or a matrix of transistor NOR circuits or of similar means of switching not having storage properties. The selection of the store register designated by the decoder 91 is also carried out by the switching network 97.

The keyboard 87 is employed for introducing the data and instructions and for commanding the various functions of the computer. It comprises a numerical part 101 formed by 10 numeral keys 0 to 9 for introducing the numbers into the store register M through the buffer register KB; in this preferred embodiment, the register M is the only store register accessible from the numerical keyboard. The keyboard 87 also comprises an address part 103 furnished with keys each commanding the selection of a register of the delay line store LDR. A function part 105 comprises the keys corresponding to the function part of one of the instructions that the computer can execute.

In the embodiment of the invention which is illustrated, the three keyboards 101, 103 and 105 control a mechanical encoder constituted by code bars cooperating with electric contacts having the aim of producing binary signals on the four lines H1, H2, H3 and H4 for representing the four bits of a decimal digit entered on the keyboard 101, the four bits of an address entered on the keyboard 103, or the four bits of a function entered on the keyboard 105. The encoder also activates one of the output lines G1, G2 and G3 for indicating which of the keyboard 101, 103 and 105, respectively has been utilized. A key 107 for the negative algebraic sign and a key 109 for the decimal point generate a binary signal on the lines SN and V, respectively, when depressed. The operation of entering a number and a decimal point into the memory via the keyboard is described in the applicants' aforecited U.S. Pat. No. 3,469,244.

The computer operates selectively in either three modes, "manual", "automatic" or "program introduction" depending upon the position in which the three-position switch 111 has been set; switch 111 generates signals PM, PA and IP. During the operation of entering the program, the signal IP being present, the address keyboard 103 and the function keyboard 105 can be operated for entering the instructions in the program register through the buffer register KB. For this purpose, the outputs H1 – H4 of the keyboard decoder can be connected through the gate 113 to the inputs 8 – 11, respectively, of the register KB. The keyboard 101 cannot be operated at this same time.

The gate 113 is controlled by the signal P0 and G1 and, in the presence of the signal A40, by the AND of said signal A40 with the signals A7 and LB1M, or, in the absence of said signal A40, by the AND of the inverse of said signal A40 with the signals A7 and T1.

During automatic operation, in which the program previously introduced into the store LDR is executed, the address keyboard 103 and the function keyboard 105 cannot be actuated.

Automatic operation of the machine is composed of a sequence of phases of extraction of the instructions and phases of execution of the instructions. During an extraction phase, an instruction is extracted from a program register and then transferred to the register 89 through the gate 193 as described in the Applicants' aforecited U.S. Pat. No. 3,469,244. This phase is automatically followed by an execution phase in which the computer executes the stored instruction. This phase is automatically followed by an extraction phase for the following instruction, which is extracted and stored in the place of the preceding one, and so on. As long as an instruction is stored in the register 89, the store register indicated by the address part of the instruction remains continuously selected and the decoder 91 continuously generates the function signal corresponding to the function part of the instruction.

During automatic operation, the numerical keyboard 101 also cannot normally be actuated inasmuch as the computer is working on data previously introduced into the store. This keyboard can be used for introducing data into the register M only when the stop instruction is stored in the instruction register 89. It is clear that the use of the stop instruction makes it possible to process much more data than the store of the computer can contain.

During manual operation, the numerical keyboard 101 and the address keyboard 103 and the function keyboard 105 can be actuated. In this kind of operation, the address keyboard 103 and the function keyboard 105 can be utilized by the operator for causing the computer to perform a sequence of operations similar to any sequence executed during automatic operation. To this end, the operator enters an address and a function by means of the keyboard 87 and these pass through the gates 115 and 117 to the register 89 in exactly the same way as happens in an instruction extraction phase in automatic operation. The two gates 115 and 117 are controlled by the signals G2, G3 and P0. By introducing an instruction (address and function) from the keyboard, an execution phase for the instruction entered is automatically started in a manner substantially the same as that of the execution phase in automatic operation. The instruction execution phase having been completed, the computer stops and waits for a fresh instruction introduced by the operator by means of the keyboard 87. When no address key is depressed, the register M is automatically addressed. Therefore, in the introduction of one of the four basic operations by means of the keyboard, the operator need not address the instruction by means of address keyboard. The operator can instead introduce a number by means of the numerical keyboard and, in this case, the operation selected is extracted on the number introduced. Accordingly, during manual operation, any arithmetic operation can be executed either on a number previously introduced into the register M by means of the numerical keyboard 101, or on the number stored in a store register selected by means of the address keyboard 103.

During automatic working, the functions indicated in the instructions are carried out on the data previously introduced into the store. Before starting the execution of the automatic program, the operator can enter the initial data by first introducing them into the register M through the numerical keyboard 101 and then transferring them to the desired register.

The keyboard 87 comprises a decimal digit printing indicator 301. This is positionable in 15 positions to which there correspond 15 binary codes emitted by the said indicator 301 in the periods T1 - T5. The said binary codes indicate the number, ranging between 0 and 15, of decimal digits which are considered in the numeric data output to recording or visual display units.

The keyboard 87 also comprises an additional-decimals indicator 303, which is positionable through 12 positions. There corresponds to 11 of the 12 positions, 11 binary codes emitted by the said indicator 303 in the periods T5 - T8, the codes indicating the number of decimal digits which are considered in the calculation. These codes are transmitted to the switching network 97. In the twelfth position, called the position FL, there is obtained as output from the indicator 303 the code 15 which will be utilized for stabilizing the total number of digits which are retained in the execution of calculations on the basis of fixed length. Calculations are carried out on this basis preserving fifteen digits in all for the results of the calculation operations and cutting off the excess decimals.

The condition register 119 (FIG. 1b) comprises a plurality of bistable devices which contains information relating to the instantaneous machine conditions, which information is used in the various parts of the computer for controlling its operation. The signals leaving the condition register 119 are indicated collectively by means of the reference letters A in FIG. 1. The particular configuration and the mode of operation of a part of the bistable devices in the embodiment of the invention which is illustrated may be similar to what is illustrated and described in the applicants' aforecited U.S. Pat. No. 3,636,523.

Returning to the diagram of FIG. 1, the sequence control unit 121 comprises a group of state-indicating bistable devices P1 - Pn which are activated one at a time. During the computer operation, it passes through the states which correspond to the particular bistable devices being activated. The computer passes through a sequence of states and executes given elementary operations during each of these.

The particular sequence of the operation states is determined by logic circuit 123. On the basis of the current state of the computer, the instruction currently stored in the register 89 and indicated by the decoder 91, and the actual internal conditions of the computer indicated by the condition register 119, the circuit 123 determines which state is to follow and activates the output 125 corresponding to the said state. After this, the change of state circuit 127 produces a change of state timing pulse MG, which enables the AND gate 129 and permits the activation of the output 125 for the purpose of activating the bistable device P1 - Pn corresponding to the next state.

OUTPUT FORMAT CONTROL FOR NUMERICAL DATA

According to one aspect of the invention, means are provided whereby the output format of numeric data can be conveniently controlled. For ease of understanding, a brief functional description of this control will first be given. Two of the recirculating registers, A and M, are used for this control sequence. Some register may have the numbers 6592441 consecutively arranged therein. What is wanted printed out, however, is 659/24/41; to accomplish this, the number is transferred from some memory location to the A register (of course, the number may be entered into A from keyboard if it is not in memory). Next, the symbols / S / S are transferred into the M register. (The symbols S stands for space and signifies nothing except that a character location is being used, that is, a bit is present in B2 slot; the S must be used in order to aline the A and M registers as will be seen). The A and R registers will therefore contain:

```
A 6 5 9 2 4 4 1
    M / S / S
```

Before the number and slashes can be properly printed out as 659/24/41, the A and M registers must be alined. This is accomplished by connecting the M register to the shift register KA in a closed loop (as aforedescribed herein and in the aforecited U.S. patents) in order to introduce a dalay of one character per memory cycle. Each memory cycle, therefore, the contents of the R register will fall behind by one character space since the R register now must traverse its normal circulation path plus the KA register which is one character long. FIG. 4 shows how the machine knows when the A and R registers are alined: bistable N3 produces an end of alinement signal when, first of all, the decimal point bit of the A register is present. As aforedescribed, the decimal points in this machine are stored in the fourth bit positions of the character slot. So, if at time T4, a bit is present on the A register line LA, it means that there is a decimal point associated with that character which is leaving the A register. If TA and LA and N4 are all UP, N3 will be produced. N4 is set UP in the following manner: The M register has been connected in a loop with the KA register so each memory cycle the symbols / S / S move to the right one space. The second bit position of each character indicates whether that character space is being used, as has been previously discussed; so if at time 2, there is a bit on LM and there is no bit in shift register stage KA1, one knows that the first character present in M is just leaving M and going to KA. S. when the first character is leaving M and the decimal point is encountered in A, the registers are alined and N3 signals this fact. The status of the registers is now:

```
A 6 5 9 2 4 4 1
  M / S / S
```

N3 causes the connection between the M register and the KA register, which had been made in the Switching Network 97, to be broken and it furthermore signals the Tag Bit Control 33 to proceed to place tag bits in the A and M registers.

The actual step-by-step mechanics of placing the tag bits will be described shortly; however, the locations where the bits are to be placed are of primary interest. There are two items of information which determine where the tag bits will be placed, first, the desired number of decimal places and, second, the maximum number of characters to be printed out. This information is fed into the machine in a manner to be discussed. If no decimal places and a maximum of 10 characters are to be printed, then the A and M registers will contain:

```
A 6 5 9 2 4 4 1 T
  M T / S / S
``` the

T'S representing tag bits. The tag bits are placed in the first bit slots (i.e. B1A and B1M) of the character positions shown above. The tag bit is first placed in the A register at the number of places to the left of the decimal point as is desired; in the above case, no decimal places are desired so the bit is placed directly to the right of the units position. Next, starting from the tag bit in the A register, the number of desired characters is counted to the left and the tag bit is then placed at this position in the M register. In the example under discussion, the desired number of characters is ten so the tag is placed in M ten character places to the left of the tag in A.

After the tag bits have been placed the machine commences the output phase; the A register is connected to the KB register which will now function as an output buffer. The M register is searched, in the usual manner, for the tag and when it is encountered, it enables the transfer of the corresponding character in the A register to the KB register. Each time the tag is encountered it is moved to the left one character position. Before a character in the A register is transferred to the KB register, the corresponding location in the M register is searched to determine whether a symbol is present and, if so, this symbol is transferred to KB before the corresponding number in A.

Each symbol in M which is to be read out has a bit in the third bit slot; so if there is a bit in M at time T1 (which would be the tag) and there is a bit in M at T3, a gate is opened to pass the M character to KB. If there is a bit in M at time T1 (tag), no bit in M at T3, pass the A character to KB and move the tag to the next M character. The tag is moved and tested for by the tag bit control 33 (FIG. 1a) in the conventional manner described in our aforecited patents and the registers are connected to KB by the conventional gates in Switching Network 77.

In this manner the numbers 6 5 9 are read into KB, then a bit is detected at T3 in M so the M character / is transferred. Next the 4 from A is transferred (since S in M has no bit in the third position but only in the second); KB will then contain 659/24/41 and this can then be sent to various output units.

A more detailed description of the above format control will now be given. The instruction which commands the above described operations is a special two character instruction of the type disclosed in our aforecited U.S. Pat. No. 3,636,523 granted June 18, 1972. The first character of the instruction goes to the instruction register 89 (FIG. 1b) from the memory LDR via Switching Network 97 in the conventional manner. This instruction commands the following character in LDR to go to shift register K13. One character of the special two character instruction is therefore in the instruction register 89 and the other is in KB. The instruction character in the instruction register is handled in the normal way as described in our cited patents. That is, the instruction passes through the decoder 91 which is a $m$ to $n$ digital-to-digital decoder of conventional construction which is used as an interface between the instruction register and the execution and control circuits. The decoder 91 sets the Condition Register 119, Sequence Control 121 and Switching Network 97 in the usual manner; that is, appropriate gates are enabled by the instruction, so that, as the machine passes through its logic states, various functions will be carried out.

The second character of the instruction which is placed in KB is handled differently. This character has, of course, 8 bits, the first four can be used to control the various aspects of the output units and do not concern the format control which forms the subject matter of this invention. For example, in this embodiment, B1 is used to tell the output unit whether alphabetic or numeric information will be read out, B2 and B3 indicate which output unit is to be used, while B4 is used to indicate direction of transfer. These four bits, which are immediately transferred to the output unit concerned, can be used for other functions depending on the type of output units untilized. Only the last four bits B5 – B8 remain in KB. These indicate the desired number of characters to be read out. It will be recalled that two items of information were used to control the length of the output number; the maximum desired number of decimal places (i.e. places to the right of decimal point) AND the number of output characters. The maximum desired length is in KB; the desired decimal places are placed in the machine by switch 301 found on keyboard 87 (FIG. 1b). After the A and M registers are aligned, as aforedescribed, the number of decimal places set by 301 pass through Switching Network 97 to shift register KA. The two shift registers KA and KB contain, therefore, the information needed for setting the tag bits.

First, the tag bit is set in the A register to the right of the last decimal place desired. This is done by first locating the decimal point in A (which is found by the coincidence of T4 and an UP bit leaving A). Next the register KA is closed in a loop with adder 34 to form a counter (in a manner described in our cited patents and in the aforecited Richards book). It will be recalled that KA contains the desired number of decimal places. Adder 34 and KA proceed to count from the decimal point in A to the left until the counter (i.e. adder 34 and KA) overflow and a carry bit is issued. While there are 36 character locations in A, assume there were only six that two decimal places were desired, and that the following number was in A:

A 623.069

The counter in our example would overflow after a count of 6 and, since the number 2 is already entered therein, after four counts a carry bit would issue. The four counts to the left from the decimal point in A would be: 1ST 3, 2ND 2, 3RD 6, 4TH 9; at this point a tag bit would be placed in the B1 position of the digit 6 in A by the tag bit control 33.

Next the tag bit must be placed in M to limit the maximum number of digits to be read out. It will be recalled that the desired maximum number of digits is in KB. This register KB is closed on Adder 35 to form a counter, the number in KB is complemented, the B1A is found (i.e., the tag bit in A which has just been placed and which is found by a coincidence of T1 and an UP bit issuing from A), and the counter counts a number of places to the left of the B1A until the counter overflows. At this point tag bit control places the tag in M.

The tags being placed, the number in A and the symbols in M may be read out into KB in the manner aforedescribed. The tag bit in M moving to the right as each character is transferred from A to KB. Each cycle includes the test of whether the tag bit in M is alined with the tag in A. (That is, if at any time T1 there are UP bits leaving both register A and M). When the tag bits are alined, this indicates that all the desired decimal places have been read out and the format control operation stops. The desired number will be in KB.

LIMIT OF DIGITS DURING CALCULATION

Another aspect of this invention is the provision of means whereby the number of digits used during calculations may be fixed. This is done in the following manner: Switch 303 (FIG. 1b) is set to the desired number of digits to be used during calculations and this selected number is placed in shift register KA. The digit limitation is done in one of the working or operation registers A; working registers receive the operands and results of the various calculations so by limiting the number of digits in one of the working registers, one effectively limits the number of digits which will be used in future calculations.

A number is placed in the A operation register. Next the most significant digit of the number is found; this is done by means of a simple logic operation: if there is an UP bit at time T4 on LA, one knows that the decimal point of the number in A is currently leaving LA. The decimal point bit causes one input of an AND gate to be set; the other input of the AND is set when, at time T2 there is no bit leaving LA. The absence of a bit in the B2 slot means that the character is not being used.

This then is how the most significant digit in A is found; the first character to the left of the decimal point which is not being used is, of course, the character immediately to the left of the most significant digit. A signal is produced by the presense of a bit at T4 in A and an absence of a bit at T2 in A; this signal causes the KA register to be connected with the Adder 34 to form a counter in a manner aforedescribed. KA has the number of desired digits to be used during calculation; the counter then counts the number of places to the left of the most significant digit in A. This count continues until the counter overflows, that in, reaches the count of 36 and signals this fact by producing a carry bit. As the counter is counting, the numbers of the A register are passing out of LA; however, as long as the count continues, these numbers are not read back into A but instead are erased. The carry bit from the counter stops the erasure and normal operation continues. So, assume there were only 10 places in A instead of 36 and that one had desired to limit calculation length to six places; A could contain, for example:

A – X X X 9 7 8 4 . 2 1 3 with the X's representing the absence of a character. The moste significant digit, 9, would be found in the manner afore described. KA would contain the number 6 so, in our example, a carry bit would not be produced until after four counts. The four counts would pass through the three blank characters to the left of 9 and through the last digit 3. The 3 therefore would not be allowed to re-enter the delay line LDR and would be lost. The carry bit would cause the machine to return to normal operation and the A register would therefore contain:

A X X X 9 7 8 4 . 2 1 X

CONVERSION BETWEEN THE FIXED AND FLOATING POINT NOTATION

While the machine normally uses fixed point notation, this can be converted to floating point. A subroutine which is in LDR or the read-only memory is normally used to effect this conversion. The number to be converted is in the A register and 0. is in the M register:

A 1 2 3 . 4

M 0 .

First the registers must be alined; this is done by connecting the M register to KB and thereby shifting the 0. to one space to the right each memory cycle in a manner completely analogous to that previously described in the Output Format chapter. One knows the registers are alined when there is a bit in both A and M at T4, (B4 being, of course, the decimal point slot.).

Each register is associated with an N20 bistable as seen in FIG. 4; the N20 tells one if characters are being read out of the associated register. If there is a bit leaving the register at T2, this means a character is present and N20 is set. It is re-set when there is no bit at T2 (the slot B2 being, of course, the slot which tells whether or not a character is present).

Also there is an N7 flip-flop which is set by the decimal point in the A register and it is reset by any nonzero number to the left of the decimal point; N8 is set by the decimal point in A and remains set. Therefore, if N8 is set and N7 is not set, the machine knows it dealing with a whole number, while, if N8 is set and N7 is also set, the machine is dealing with a fraction.

M register is connected with the KB register; if N7 is down, N8 is up, and N20 is up, the A register is connected with the KB register by 97 and the number in A and the decimal point are shifted to the right until the N20 signal disappears. The N20 disappears only when no more digits are leaving A. Each time the number in A is shifted, a count is added to the 0. in M. Our example was

A 1 2 3 . 4

M 0 .

After shifting, the registers would contain

. 1 2 3 4

3 .

If the number in our example were a fraction, the 0. in M would have been shifted to the right and a count subtracted from M each shift.

The numbers in A and M may now be joined in a single register to read 3.1234 which means $.1234 \times 10^3$.

SEPARATING EXPONENT AND MANTISSA

If a number in scientific notation is to be converted back into normal fixed point, the exponent must be first separated from the mantissa by the circuit of FIG. 6. Assume 5.73 (i.e. $.73 \times 10^5$) is in A. This number is shifted one character at a time into KB and then into KA. Gate S4 is closed so that, as a character is shifted into KA, it destroys the character which had been previously placed therein. Besides going into KA, the characters pass through S1, which is open, and re-enter A.

In our example, first the 3 and then the 7 would pass through KB and S1 and be re-written in A; the 3 would also go into KA and would be lost when the 7 replaced it therein.

The 5 has a bit in its B4 slot; that is, the decimal point slot. In order to find the digit with the decimal point stage K4 is interrogated at every time T8. At time T8 all 8 bits of a number are arranged in KB with B1 in KB1, B2 in KB2, and so forth. So if there is a bit in KB4 at time T8, one knows that the decimal point number (i.e. 5.) is located therein. N12 is set by KB4 and T8 opens gate S3 leading to the M register so that the eight bits which represent 5. will be placed in M.

Register A contains 73 but what must be placed in A is 0.73 with the 0. having the same sign (+ or −) as the 73. As the 5. is being shifted out of KB into M, it is also being shifted into KA; KA contains the 7 having the sign bit B3 in KA3. At time T3, however, the sign bit of the 7 is just being forced out of the KA register by the 5. Normally, these bits which are forced out of KA are lost because S4 is closed; however, at T3, S4 is opened allowing the sign bit B3 to be placed in A. N11 (FIG. 4) is produced by the "and" of T2 and KB2; the decimal point bit, B4, of 5 will be in KB2 at time T2 causing N11. The production of N11 shuts gate S1 so as to prevent the 5. from going into A. However N11 was not produced until time T2 thereby allowing the first two bits of the 5 to go into A. The B1 bit is zero in all cases but the B2 is 1 which indicates that a digit is present and this is needed in A to represent the 0. of 0.73. The B2 from the 5 gives the presence bit to the 0 and the B3 from the 7, which passes through S4, gives the sign bit to the 0.

After time T2, N11 is present so gate S1 is closed; however at time T4 the decimal point bit of 5. is just leaving KB and, at this time, S2 is opened allowing the bit to pass into A. The bit represents the decimal point for 0. and the 0.73 is complete in A and 5. is in M.

READING AND WRITING ON PROGRAM CARDS

The electronic computer according to the invention is provided with a device which can be selectively activated both for introducing into the internal store program instructions which are contained on magnetic supports of the card type, and for extracting and recording on magnetic cards data or a particular program or subroutine contained in the internal store. The program instructions or the data contained on the said magnetic cards are stored serially along a recording track as is described in our U.S. Pat. No. 3,495,222. In known desk-top computers which utilize magnetic cards, the reading and writing thereon takes place by means of a head; the card is moved with respect to the head under the control of an entraining device. Therefore, a reader for magnetic cards of the aforesaid type requires a constant feed rate for the card and the card itself must be alined with respect to the reading and writing head.

Reading and writing devices for desk-top computers are known in which the guides in which the magnetic card slides are produced with metal covers which guide the card in the direction of movement. The use of these covers does not ensure proper alignment of the card because of the excessive tolerance inherent in this type of construction; in order to aline the card, use is made of continuously rotating rollers inclined with respect to the direction of movement of the card which rollers press the card itself against one of the side walls of the cover which acts as a reference wall. However this causes wear of the card and, consequently, ruins the alignment of the recording track with respect to the magnetic head.

In the known constructions, the reading of and writing on the card is obtained with a magnetic head carried by an oscillating arm pressed against the card; the problems of alignment between the card and the head are complicated by the mobility of the head itself. Moreover, in these known constructions, the devices for entraining magnetic cards are formed by means of a series of rollers and counter-rollers rotating continuously and in contact with the card. However, owing to high entraining speeds, these rollers are not sufficient to ensure the absence of sliding between the entraining device and the card and breaks therefore occur in the movement.

The reading and writing device according to the invention is characterized in that the card is moved by an entraining device along a path defined by two guides having parallel profiles and supported by a pair of support plates, the reading or writing is effected by a magnetic head co-operating with a card-pressing roller, and the profiled guides, which defines the path of the card in the direction of the feed movement, are mounted between the two support plates which are in turn disposed parallel and at right angles to the guides in such manner as to align the said card with respect to the magnetic head. The head is fixed to one of the said support plates, while the entraining device is a belt movable in the feed direction and kept in contact with the card carried along by means of a series of counter-rollers.

Figure 7:
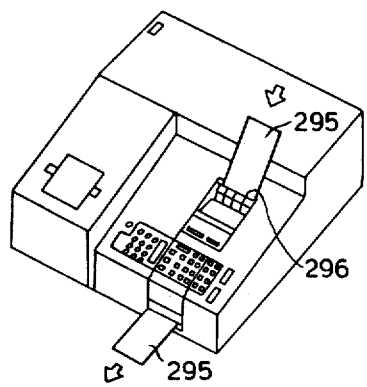
FIG. 7 is a perspective view of a programmable electronic computer in which there is inserted a device for reading and/or writing on programme supports in the form of magnetic cards.

FIG. 7 illustrates in perspective view an electronic desk-top computer in which the opening 296 for manual introduction of the cards 295 into the reading and writing device.

Figure 8A:
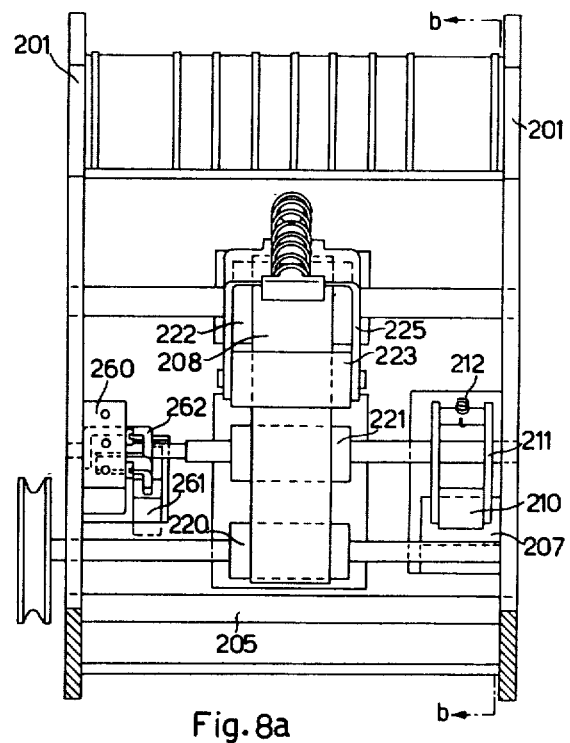
FIGS. 8a and 8b are a front view and a section, respectively, of a reading and/or writing device included in the computer according to FIG. 7.
Figure 8B:
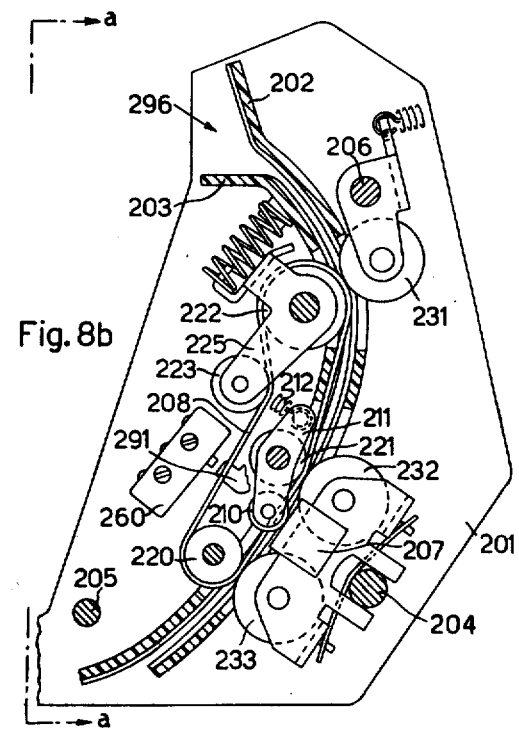
Figure 5:
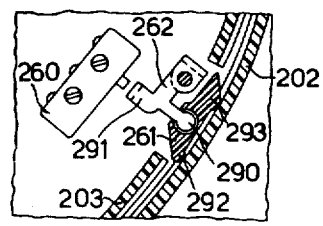
FIG. 5 illustrates a detail of the reading and/or writing device of FIGS. 8a and 8b.

The device according to the invention for reading and writing on magnetic cards (FIGS. 8a, 8b, 5) permits perfect alignment of the card with respect to the reading and writing head by employing a pair of plane support plates 201 between which there are mounted two parallel profiled guides 202 and 203 which guide the magnetic card 295 in the direction of movement along the feed path. These support plates are parallel and at right angles to the said guides and the distance between them, equal to the width of the magnetic card, is precisely fixed the spacers 204, 205 and 206; the plates 201 act as aligning surfaces.

The magnetic head 207 is fixed to one of the support plates; in correspondence with this head, the guide 203 has a window through which a roller 210 is mounted. Roller 210 is mounted on an oscillating support 211 and is subject to the action of a spring 212.

The feed or advance of the card 295 is performed by an entraining belt 208 carried by a driving roller 220 and two return rollers 221 and 222; the belt is stretched by tensioning roller 223 mounted on oscillating arm 225. This belt, moving parallel to the aligning plates and in the direction of advance along the feed path, produces the entraining action by friction on the opposite face of the card to that on which recording is effected by cooperating with a series of counter-rollers 231, 232 and 233. In correspondence with this belt the profiled guides 202 and 203 have windows which enable the belt and the counter-rollers to contact the card. The reading and writing device according to the invention therefore ensures movement of the card without slipping inasmuch as the entraining belt adheres to, or keeps in contact with, the card at its non-magnetized face over a portion of the said belt, while on this face there operate only a number of counter-rollers which ensure the pressure necessary for the movement by acting only by means of a limited series of linear contacts.

On one of the support plates, in a position corresponding to that of the magnetic head, there is mounted a device detecting the presence of a card, the device being constituted by a control microswitch 260 and an actuating means 280. The latter comprises a shoe 261 hinged at the end 290 of a lever 262 provided with a tooth 291 for activating the microswitch 260.

In the portion which comes into contact with the face of the card opposite that on which recording is effected, the shoe 261 has two projections 292 and 293 which obstruct the path of the card; only when the card has passed below both the projections of the said shoe is the lever 262 turned through an angle sufficient to actuate the control microswitch by means of the tooth 291.

A detailed description of the methods by which a computer effects the reading and writing of information, data or instruction on a magnetic card is contained in U.S. Pat. No. 3,495,222.

If the condition of reading of the card is selected, each group of eight character bits read on the card is transferred serially along the line H in FIG. 1 and stored in the shift register KB. In the interval separating two successive characters recorded on the card, the said 8 bits are transferred from the shift register KB to the store register addressed at that moment. Similarly, if the condition of writing on the card is selected, in the interval separating two character locations on the card a character is transferred from the store register addressed at that instant to the shift register KB. Thereafter, this character is extracted sequentially bit by bit from the shift register KB and recorded serially on the magnetic card.

In the reading phase, the internal store registers affected by the operation of transfer of data or instructions from a card to them undergo an erasure of their previous content on superimposition of the new information content. the operation of transfer of data or instructions from the store registers to a card or vice versa takes place sequentially and automatically for all the registers addressed at the moment of the selection of the condition of writing or reading, respectively.

The computer according to the invention is set up in such manner that the interpretation of a "closing instruction" extracted from the internal store or from the card and transferring to the shift register KA compounds the interruption of the writing or reading, respectively, on the card of the content of every storage location following that occupied by the "closing instruction". In the writing phase, this stopping takes place after the said instruction has been recorded on the card. In the phase of reading of the magnetic card, the presence of the said instruction in the shift register KA inhibits the erasure and introduction of information in store locations not yet addressed for storing information read from the card.

The use of this closing instruction proves useful, for example, for limited programs which do not occupy the entire card track, inasmuch as this allows the store part available for the deposit of data to be extended and the reading from card of a limited program which terminates with this special instruction ensures that possible numeric data previously calculated and which are to be re-processed are not erased from the computer store.

We claim:

1. In a digital electronic computer comprising: a memory including a first and a second register, the first register receptive of a number to be converted from fixed to floating point notation, the second register receptive of a significant zero digit associated with a decimal point; shifting means selectively operable too shift the contents of either of said registers; aligning means operable to control said shifting means to first shift the content of said second register until the decimal point stored therein is aligned with the decimal point stored in said first register; indicating means for indicating whether the number stored in said first register is greater or less than one; and control means responsive to said indicating means to control said shifting means to next shift the contents of one of said registers when said number is greater than one and alternatively to shift the contents of the other of said registers when said number is less than one, said control means including means for detecting the highest significant digit of the digits of said first register to stop said shifting means when the decimal point of said second register is aligned with the location of the next higher order with respect to the highest significant digit of said first register, and counting means responsive to said shifting means to effect said second register to be incremented or decremented by one in dependence upon the direction for each shifting, whereby the first register contains the mantissa and the second register contains the exponent of the floating point notation.

* * * * *